United States Patent [19]

Ishida

[11] Patent Number: 5,120,391
[45] Date of Patent: Jun. 9, 1992

[54] TAPE BONDING APPARATUS

[75] Inventor: Hisao Ishida, Tokorozawa, Japan

[73] Assignee: Kabushiki Kaisha Shinkawa, Tokyo, Japan

[21] Appl. No.: 510,151

[22] Filed: Apr. 16, 1990

[30] Foreign Application Priority Data

| Apr. 17, 1989 | [JP] | Japan | 1-96944 |
| Apr. 17, 1989 | [JP] | Japan | 1-96945 |
| Apr. 17, 1989 | [JP] | Japan | 1-96946 |

[51] Int. Cl.$^5$ .......................................... B32B 31/10
[52] U.S. Cl. ................................. 156/552; 156/302; 228/6.2; 228/180.2; 29/827; 29/840
[58] Field of Search ................. 29/827, 840; 228/6.2, 228/180.2; 156/552, 302

[56] References Cited

U.S. PATENT DOCUMENTS

| 3,937,386 | 2/1976 | Hartleroad et al. | 228/180.2 |
| 3,941,297 | 3/1976 | Burns et al. | 228/180.2 |
| 4,050,618 | 9/1977 | Angelucci et al. | 228/5.7 X |
| 4,166,562 | 9/1979 | Keizer et al. | 228/5.1 |
| 4,526,646 | 7/1985 | Suzuki et al. | 156/230 X |

FOREIGN PATENT DOCUMENTS 63-15433  1/1988  Japan ........................... 228/6.2

Primary Examiner—Michael W. Ball
Assistant Examiner—Mark A. Osele
Attorney, Agent, or Firm—Koda and Androlia

[57] ABSTRACT

A tape bonding apparatus including a bonding guide for guiding a tab tape, which has leads, to a bonding position, a clamper located under the bonding guide for pressing the tab tape against the bonding guide, a pellet stage provided beneath the clamper, and a vertically movable bonding tool located above the bonding guide, in which a hole formed in the clamper is larger than opening of the tab tape, and the holes formed in the bonding guide and clamper are about the same in shape as the opening of the tape so as to prevent the leads set on the tab tape from coming into contact with the clamper, thus avoiding any damage to the leads. Also, the bonding guide is flat near the bonding position, and the pellet stage is smaller than the window of the clamper.

1 Claim, 1 Drawing Sheet

TAPE BONDING APPARATUS

BACKGROUND OF THE INVENTION

1. Field of the Invention

The present invention relates to a tape bonding apparatus used to bond the lead, which is placed on the tab tape, to a semiconductor pellet of the bump element.

2. Prior Art

One example of prior art tape bonding apparatus is described in Japanese Patent Application Laid-Open No. 63-15433. The processes employed in this tape bonding apparatus is that the bonding tool is moved downwards, and a stage on which a semiconductor pellet is placed is moved upwards while tab tape leads are held between bonding guide and a clamper; then, the leads of the tab tape are pressed against the semiconductor pellet via the bonding tool. In this apparatus, forming of the leads is performed by moving the bonding guide and clamper upward when the bonding tool presses the leads against the semiconductor pellet.

The prior art apparatus described above, however, has several problems. One problem is that the leads can be damaged by the clamper when the leads are contacted to the clamper. This happens because no consideration has been given to the positional and configurational relationship between the window formed in the clamper and the opening of the tab tape. In addition, the window of the clamper is smaller than the opening of the tab tape.

SUMMARY OF THE INVENTION

Accordingly, a main object of the present invention is to provide a tape bonding apparatus that can avoid damaging the tab tape.

The above-mentioned and other objects of the present invention are accomplished by forming a window provided in the clamper the same or larger in size than the opening of the tab tape, and by forming windows of both the bonding guide and the clamper substantially the same in shape as the opening of the tab tape.

With such a structure, since the window formed in the clamper is larger than the opening of the tab tape, leads of the tab tape do not touch the edges of the window of the clamper. Thus, the leads are not damaged when it is pressed down by a bonding tool. Also, since the shape of the windows of both the clamper and the bonding guide are about the same as that of the opening of the tab tape, the tab tape can be clamped or held evenly by the clamper and bonding guide, thus allowing stable bonding to be performed.

DETAILED DESCRIPTION OF THE INVENTION

Figure 1:
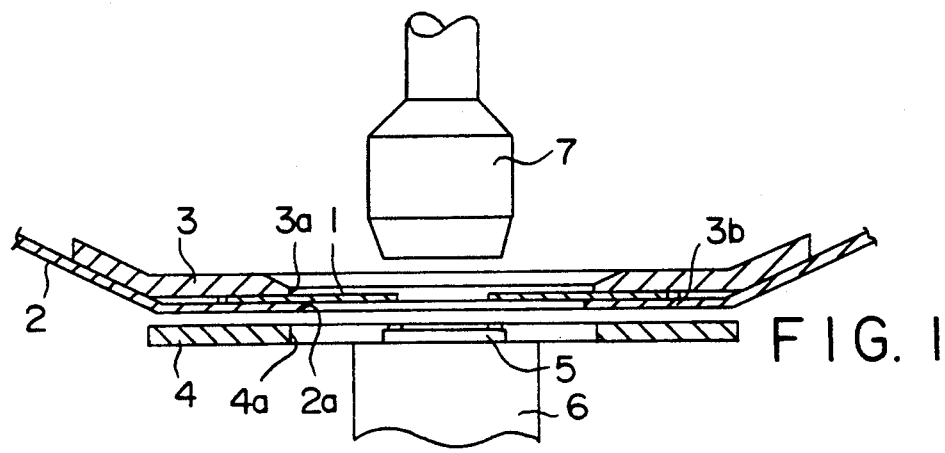
FIGS. 1, 2 and 3, respectively, are front views showing actions of the main part of the bonding apparatus of the present invention.
Figure 2:
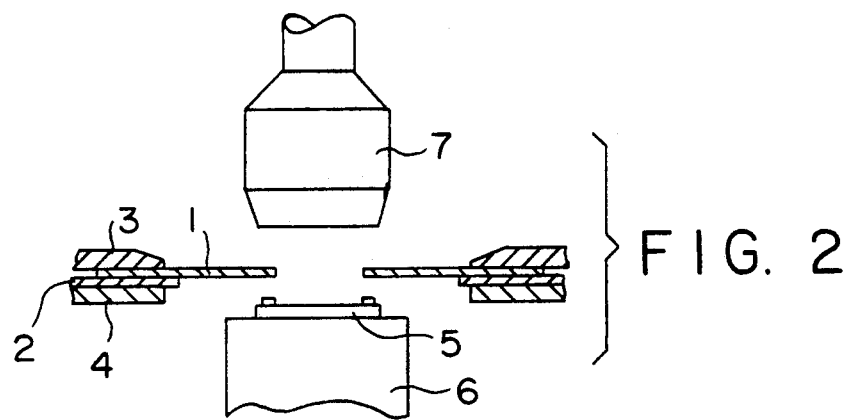
Figure 3:
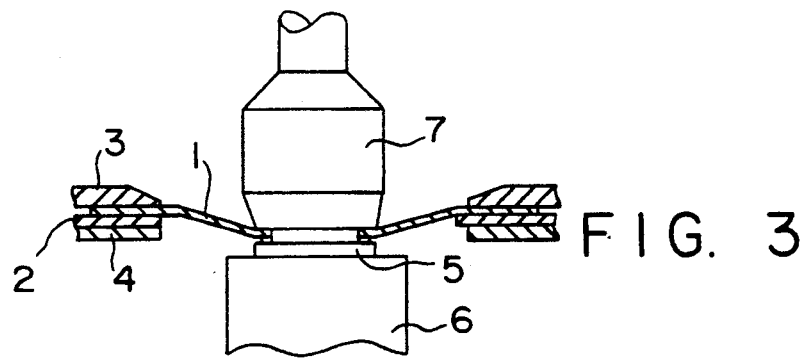

In FIGS. 1 through 3, reference numeral 3 is a bonding guide (or tape guide) which guides the tab tape 2 to a bonding position, which is between a pellet stage 6 and a bonding tool 7. The tab tape 2 has a lead 1 which sticks out into an opening 2a of the tape.

The bonding guide 3 has an opening or a window 3a which is substantially the same in shape as the opening 2a of the tab tape 2. A flat section 3b is formed in the bent bottom part of the bonding guide 3 so that the flat section 3b positions in the neighbor of the bonding position.

A clamper 4 has an opening or a window 4a which is about the same shape as the opening 2a of the tab tape 2. The size of the window 4a is the same as or larger than the opening 2a of the tab tape 2. The clamper 4 is movable up and down (or opened and closed) by a clamper opening/closing means (not shown). In other words, when the clamper 4 is moved up, it holds the tab tape 2 between the bonding guide 3 and the clamper 4. This is called, "the clamper 4 is closed" in the specification. On the other hand, when the clamper 4 is moved down, it can release the tape 2. This is called, "the clamper 4 is opened." The clamper 4 is made of a material that has a small thermal expansion coefficient such as invar.

The pellet stage 6 is mounted on an X-Y table (not shown) of the bonding apparatus. Semiconductor pellet 5 is placed on the pellet stage 6 so that the semiconductor pellet 5 is set at the bonding position. The pellet stage 6 is smaller than the window 4a of the clamper 4 in size. In other words, the diameter of the pellet stage 6 is smaller than the diameter of the window 4a of the clamper 4 (when the pellet stage 6 and window 4a are both circular in shape).

The pellet stage 6 is provided so that the top surface of the stage 6 is maintained below the under surface of the bonding guide 3 with a certain distance kept from the bonding guide 3. This is for the purpose of performing the forming of the lead 1.

In operation, as seen in FIG. 1, the tab tape 2 is fed by a feeding mechanism (not shown) while the clamper 4 is opened so that the lead 1 of the tab tape 2 is positioned at the bonding position. Then, the clamper 4 is closed as seen in FIG. 2. During this operation, the semiconductor pellet 5 on the pellet stage 6 is waiting at the bonding position for the bonding operation to be performed.

Then, the distance between the lead 1 and the semiconductor pellet 5 is detected via a detector (not shown), and the stage 6 is moved in X-Y direction so that the position of the lead 1 and the electrode of the semiconductor pellet 5 is adjusted so as to perform bonding.

After this, as seen in FIG. 3, the bonding tool 7 is lowered, and the lead 1 is pushed down by the bonding tool 7. Thus, the lead 1 is pressed against the electrode of the semiconductor pellet 5. In this case, the tab tape 2 is securely held by the bonding guide 3 (especially the flat section of the bonding guide 3) and the clamper 4, and the lead 1 is pushed down by the bonding tool 7. Accordingly, the forming of the lead 1 is performed by the bonding tool 7 while the tab tape 2 is held by the bonding guide 3 and the clamper 4. The bonding tool 7 is then moved up, the clamper 4 is opened, and the tab tape 2 is fed one pitch in order to set the next lead at the bonding position. This process is repeated in the same sequence.

Since the bonding guide 3 has a flat section, the tab tape 2 is fed horizontally. As a result, the lead 1 does not bend, and the part of the lead 1 to be bonded is stably fed to the bonding position.

Since the pellet stage 6 is smaller than the window 4a of the clamper 4 (in other words, the stage 6 is small in diameter than the window 4a when both of them are circular), it is possible to open and close the clamper 4 without moving the pellet stage 6 up or down. In addition, since a distance is kept between the bonding guide 3 and pellet stage 6, forming of the lead 1 can be performed by applying stress to the lead 1 via the bonding tool 7 moving down upon the lead 1. Thus, it is not necessary to move the bonding guide 3 and the clamper 4 upward.

The above embodiment is described with reference to an example wherein the semiconductor pellet is bonded to the lead 1 of the tab tape 2. However, the present invention can be used for a bonding apparatus wherein a bump element is bonded to leads of the tab tape as in the case of transcription bump bonding.

In addition, though the above embodiment describes a single lead 1, the present invention is applicable to the cases in which the leads are in plural number.

As described above, in the present invention the window of the clamper is larger than the opening of the tab tape. Accordingly, leads do not come into contact with the (edge of the) window of the clamper when it is pushed down by the bonding tool, thus the leads are free from damage. Furthermore, since the window shapes of both the clamper and the bonding guide are substantially the same as the opening of the tab tape, the tab tape as a whole can be evenly held by the bonding guide and the clamper with regard to the leads. As a result, stable bonding can be performed.

We claim:

1. A tape bonding apparatus comprising: a bonding guide, provided with a window, for guiding a tab tape, provided with a plurality of openings and leads placed on the tape, to a bonding position; a clamper, provided with a window, located under said bonding guide so as to press said tab tape against said bonding guide; a pellet stage which is for placing thereon a semiconductor pellet and provided under said clamper at said bonding position; and a bonding tool located above said bonding guide in a manner to move up and down, wherein said window in said clamper is larger than any of said openings of said tape, and said window of said bonding guide and said window of said clamper are each substantially the same in shape as said openings of said tab tape.

* * * * *

UNITED STATES PATENT AND TRADEMARK OFFICE
CERTIFICATE OF CORRECTION

PATENT NO. : 5,120,391

DATED : June 9, 1992

INVENTOR(S) : HISAO ISHIDA, et al.

It is certified that error appears in the above-identified patent and that said Letters Patent is hereby corrected as shown below:

On the title page:

Insert:

Column [75] Inventors:  --Koji Sato, Tokyo, Japan--

Signed and Sealed this

Thirty-first Day of August, 1993

Attest:

BRUCE LEHMAN

Attesting Officer

*Commissioner of Patents and Trademarks*